United States Patent
Fink

(10) Patent No.: US 7,166,170 B2
(45) Date of Patent: Jan. 23, 2007

(54) CYLINDER-BASED PLASMA PROCESSING SYSTEM

(75) Inventor: Steven T. Fink, Mesa, AZ (US)

(73) Assignee: Tokyo Electron Limited, Tokyo (JP)

( * ) Notice: Subject to any disclaimer, the term of this patent is extended or adjusted under 35 U.S.C. 154(b) by 277 days.

(21) Appl. No.: 10/476,883

(22) PCT Filed: May 7, 2002

(86) PCT No.: PCT/US02/11875

§ 371 (c)(1),
(2), (4) Date: Apr. 1, 2004

(87) PCT Pub. No.: WO02/093605

PCT Pub. Date: Nov. 21, 2002

(65) Prior Publication Data

US 2004/0149210 A1  Aug. 5, 2004

Related U.S. Application Data

(60) Provisional application No. 60/291,337, filed on May 17, 2001.

(51) Int. Cl.
| | | |
|---|---|---|
| C23C 16/00 | (2006.01) | |
| C23C 16/50 | (2006.01) | |
| H01L 21/02 | (2006.01) | |
| H01L 21/3065 | (2006.01) | |

(52) U.S. Cl. .................... 118/733; 118/715; 156/345.1; 29/525.02; 29/700; 29/282
(58) Field of Classification Search ................ 118/715, 118/733; 156/345.1; 29/525.01, 525.02, 29/700, 282

See application file for complete search history.

(56) References Cited

U.S. PATENT DOCUMENTS

| | | | | |
|---|---|---|---|---|
| 3,741,886 A | * | 6/1973 | Urbanek et al. | 204/298.12 |
| 4,253,417 A | * | 3/1981 | Valentijn | 118/733 |
| 4,512,790 A | * | 4/1985 | Faure et al. | 65/530 |
| 4,556,471 A | * | 12/1985 | Bergman et al. | 204/298.41 |
| 5,091,208 A | | 2/1992 | Pryor | 427/38 |
| 5,336,324 A | * | 8/1994 | Stall et al. | 118/719 |
| 5,520,142 A | | 5/1996 | Ikeda et al. | 118/715 |
| 5,544,618 A | * | 8/1996 | Stall et al. | 117/102 |
| 5,641,358 A | * | 6/1997 | Stewart | 118/715 |
| 5,676,757 A | * | 10/1997 | Ikeda et al. | 118/733 |
| 6,055,927 A | * | 5/2000 | Shang et al. | 118/723 ME |
| 6,073,576 A | | 6/2000 | Moslehi et al. | 118/723 E |
| 6,331,212 B1 | * | 12/2001 | Mezey, Sr. | 118/725 |
| 6,338,872 B1 | * | 1/2002 | Yoshino et al. | 427/248.1 |

(Continued)

OTHER PUBLICATIONS

Rolled Ring Forging, Scot Forge, http://www.scotforge.com/sf_facts-rollring.htm.*

*Primary Examiner*—Jeffrie R. Lund
(74) *Attorney, Agent, or Firm*—Oblon, Spivak, McClelland, Maier & Neustadt, P.C.

(57) ABSTRACT

A method and system for reducing the cost of a vacuum processing system by utilizing separately fabricated parts for the walls and the tops and bottoms of chambers. Walls are formed from cylinders (e.g., aluminum tubing or rolled ring forgings), and plates are then hermetically sealed to the top and bottom of the cylinder. Fasteners (and the vacuum inside the chamber) clamp the plates to the cylinder.

21 Claims, 2 Drawing Sheets

U.S. PATENT DOCUMENTS 6,551,406 B2 * 4/2003 Kilpi .......................... 118/728
6,734,947 B2 * 5/2004 Watson et al. ................ 355/30
2004/0149210 A1 * 8/2004 Fink .......................... 118/715

* cited by examiner

CYLINDER-BASED PLASMA PROCESSING SYSTEM

BACKGROUND OF THE INVENTION

1. Field of the Invention

The present invention is directed to a cylinder-based vacuum processing system and a method of making the same, and, in one embodiment, to a tubing or rolled ring forging-based chamber wall.

2. Discussion of the Background

Known manufacturers have traditionally built process chambers and robotic transfer chambers of plasma processing systems from billets of material, i.e. blocks of aluminum. Those chambers are built at considerable cost due to both the cost of the original material and the cost of machining. In fact, a large portion of the original material often becomes waste in the machining process. For example, the total cost for manufacturing a chamber suitably sized for 200 mm substrate processing can exceed $25K when using the aforementioned fabrication practices.

SUMMARY OF THE INVENTION

Accordingly, it is an object of the present invention to provide a method of manufacturing those chambers that reduces their costs. This object and other objects of the present invention are addressed by utilizing separately formed wall and end pieces instead of machining out a solid billet of material. In one such embodiment, the chamber walls are formed from the inner wall of a tubing or forging, and the top of the tubing or forging is smoothed to allow O-ring sealing (e.g., to standard smooth plates that are separately manufactured).

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE PREFERRED EMBODIMENTS

Figure 1:
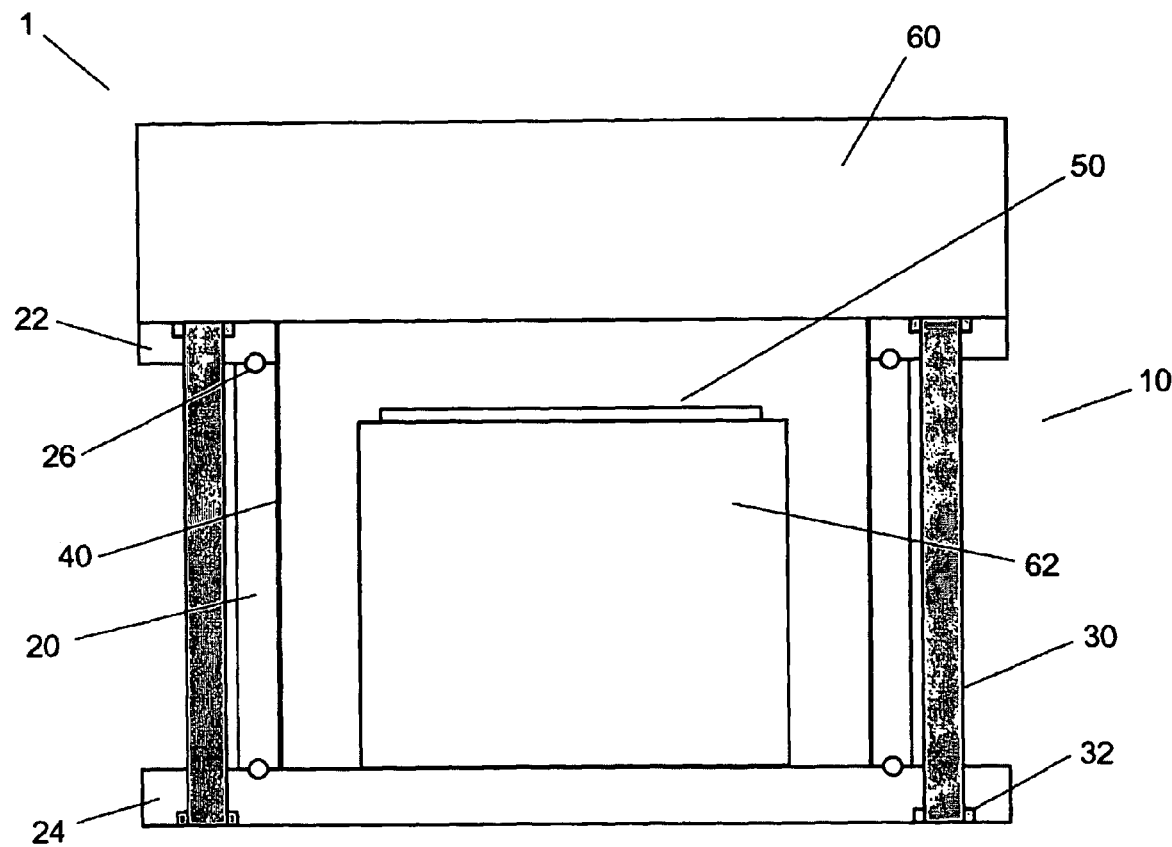
FIG. 1 is a cross-section of a plasma processing chamber formed by utilizing a chamber wall formed from a ring and top and bottom plates, wherein the ring is formed separately from the plates.

Turning now to FIG. 1, a vacuum processing system 1 comprising a chamber 10 formed according to the present invention includes a cylinder (e.g., aluminum tubing or rolled ring forging) acting as a chamber wall 20 to which top 22 and bottom 24 chamber plates are hermetically sealed. For example, manufacturing the chamber wall 20 from a rolled ring forging can reduce fabrication costs, including material cost and machining cost, of a processing system suitable for 200 mm materials processing by more than a factor of five (5), i.e. a reduction in the fabrication cost from $25K (as described above) to $5K. An equivalent cost saving, if not larger, can be attained for larger processing systems, i.e. 300 mm, 400 mm, etc.

In order to provide a good seal, preferably O-rings 26 are placed between the cylinder and the plates. The components are then held together using a series of fasteners.

As shown in FIG. 1, one possible set of fasteners includes all-thread fasteners 30 with associated nuts and washers 32. In the illustrated configuration, the fasteners 30 are placed into the top plate 22 and extend out of the bottom plate 24 where the nuts and washers 32 are placed on them. As would be understood, the direction of the fasteners 30 could be reversed. Moreover, as is shown, the fasteners 30 need not be machined through the chamber wall 20 in order to properly seal the plates 22, 24 to the chamber wall 20. This further reduces machining costs.

In light of the fact that the chamber wall 20 is so easily accessible and cost effective, it is possible to build the chamber 10 with a chamber wall 20 comprising a "protective" or "sacrificial" layer 40 as shown in FIG. 1. Therein, the chamber wall 20 itself comprises the process liner 40, and when dirty or used, the entire chamber wall 20 is simply replaced with a new chamber wall 20, and the top 22 and bottom 24 plates are reconnected. The process liner 40 can comprise an aluminum oxide layer formed on the inner surface of the chamber wall 20 by an anodization process, or it can comprise a spray coating such as spray-coated $Y_2O_3$.

In an alternate embodiment, the process liner 40 is separate from the chamber wall and comprises a replaceable consumable to be inserted within the inner diameter of chamber wall 20. The process liner 40 can be fabricated from silicon, silicon carbide, carbon, quartz, or any other conventionally employed material.

In an alternate embodiment (not shown), the top plate 22 is not bolted on to the top of the chamber wall 20, but is rather connected by a hinge and a latch. In this configuration, the top of the chamber 10 can be accessed quickly such that components therein (e.g., the chamber liner 40) can be maintained or replaced. In such an embodiment, the bottom plate 24 may be attached to the bottom of the chamber wall using bolts that screw into threads machined into chamber wall 20. Similarly, the hinge may be bolted to the chamber wall using threads formed in the chamber wall 20. Alternatively, like the embodiment of FIG. 1, the hinge may couple directly to bolts passing through the bottom plate 24.

In an alternate embodiment, grounding components are also placed between the chamber wall 20 and the plates 22, 24 so as to ensure proper grounding. These elements can be added at the same time that the O-rings are added. An exemplary element utilized to improve the electrical connection between chamber components includes Spira-Shield®.

As described above, the fasteners 30 clamping the top 22 and bottom 24 plates to the chamber wall 20 need not be run in channels machined into the chamber wall. It is, however, possible to do so, but would likely require an increased time and/or expense. If machining in the chamber walls 20 is performed, the channels created can be used for any number of functions. One such function is to provide temperature control of the chamber wall 20. Either coolant can be run through the channels or heating coils can be placed therein. In either configuration, the target temperature of the chamber wall 20 is monitored, and the heating and/or cooling is controlled accordingly.

In a preferred embodiment, the vacuum processing system 1 is a plasma processing system for materials processing of a substrate 50 (e.g., a semiconductor wafer or a liquid crystal display panel). As shown in FIG. 1, the vacuum processing system 1 includes an upper electrode assembly 60 for generating a process plasma and further comprises a substrate holder (or chuck) 62 to support the substrate 50. The system described in reference with FIG. 1 is a capacitively coupled plasma (CCP) reactor.

Figure 2:
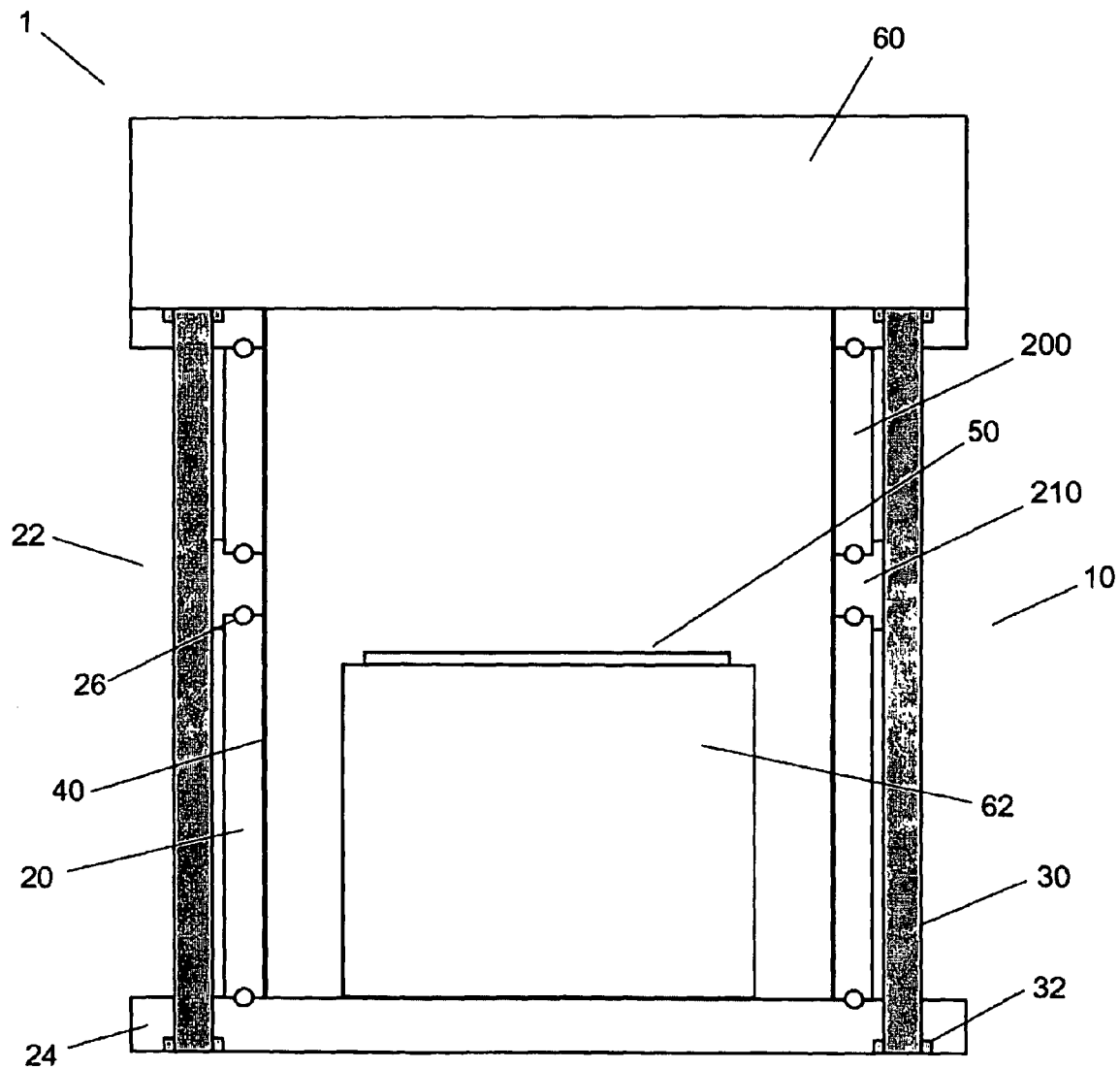
FIG. 2 is a cross-section of a plasma processing chamber formed by utilizing (1) a chamber wall formed from plural rings and (2) top and bottom plates, wherein the plural rings are formed separately from the plates.

In light of the relatively fast assembly process, it is possible to quickly change the chamber height when changing between processes or wafer sizes. By replacing a shorter chamber wall 20 with a longer chamber wall 20 (or vice versa), the height-to-diameter ratio is easily changed. In addition, as shown in FIG. 2, the height can quickly be increased by taking off the top plate, adding at least one additional chamber wall 200 on top of the original chamber wall 20 via alignment plate 210, and replacing the top plate 22. Similarly, the height can be decreased by removing chamber wall components in an existing stack of chamber wall components. To aid in (1) aligning the stack of chamber walls 20, 200, etc. and (2) forming a seal, each chamber wall component can optionally include recesses in their tops and bottoms such that alignment pins can be introduced therein. The top 22 and bottom 24 plates may also be sealed to the chamber wall 20 utilizing bolts threading directly into the chamber wall 20.

Chambers 10 according to the present invention are not limited to the capacitively coupled plasma reactors as shown in FIG. 1. Other configurations are possible, but may require machining openings or slits in the side of the cylinder wall.

Numerous modifications and variations of the present invention are possible in light of the above teachings. It is therefore to be understood that, within the scope of the appended claims, the invention may be practiced otherwise than as specifically described herein.

The invention claimed is:

1. A vacuum processing system comprising:
   top and bottom plates;
   a first chamber wall separately formed from the top and bottom plates;
   a second chamber wall separately formed from the top and bottom plates and first chamber wall;
   a single alignment plate including upper and lower mating surfaces, disposed between the first chamber wall and second chamber wall and connecting the bottom of the first chamber wall to the top of the second chamber wall via the upper and lower mating surfaces, respectively;
   fasteners extending from the top plate to the bottom plate and configured to seal the top and bottom plates to the first and second chamber walls and to seal the first chamber wall to the second chamber wall via the alignment plate, respectively.

2. The improvement as claimed in claim 1, wherein one of the chamber walls is formed as a tube.

3. The improvement as claimed in claim 1, wherein one of the chamber walls is formed as an aluminum tube.

4. The improvement as claimed in claim 1, wherein one of the chamber walls is formed as a rolled ring forging.

5. The improvement as claimed in claim 1, further comprising O-rings for sealing the top and bottom plates to the chamber walls.

6. The improvement as claimed in claim 1, wherein the fasteners comprise all-thread fasteners, nuts and washers.

7. The improvement as claimed in claim 1, wherein the fasteners comprise a latch and a hinge for the top plate.

8. The improvement as claimed in claim 1, wherein one of the chamber walls comprises a chamber wall having machined channels for passing at least one of a heating element and a coolant.

9. The improvement as claimed in claim 1, wherein the fasteners seal the top and bottom plates to the first and second chamber walls without passing through the first and second chamber walls.

10. A variable height vacuum chamber system comprising:
    top and bottom plates;
    a first chamber wall separately formed from the top and bottom plates;
    a second chamber wall formed separately from the top and bottom plates and from the first chamber wall;
    fasteners extending from the top plate to the bottom plate and configured to seal the top and bottom plates to the first and second chamber walls, respectively, and
    a single alignment plate including upper and lower mating surfaces configured to fit between the first and second chamber walls and to connect a bottom of the first chamber wall to a top of the second chamber wall via the upper and lower mating surfaces respectively,
    wherein the fasteners are configured to seal the first chamber wall to the second chamber wall via the alignment plate.

11. The vacuum chamber, as claimed in claim 10, wherein one of the chamber walls is formed as a tube.

12. The vacuum chamber, as claimed in claim 10, wherein one of the chamber walls is formed as an aluminum tube.

13. The vacuum chamber, as claimed in claim 10, wherein one of the chamber walls is formed as a rolled ring forging.

14. The vacuum chamber, as claimed in claim 10, further comprising O-rings for sealing the top and bottom plates to the first and second chamber walls, respectively.

15. A plasma processing system of variable height comprising:
    a substrate holder;
    a robotic system for transporting substrates onto the substrate holder;
    an RF power coupling device; and
    a vacuum chamber, including:
    top and bottom plates;
    a first chamber wall separately formed from the top and bottom plates;
    a second chamber wall separately formed from the top and bottom plates and from the first chamber wall;
    fasteners extending from the top plate to the bottom plate and configured to seal the top and bottom plates to the first and second chamber walls and to seal the first chamber wall to the second chamber wall via the alignment plate, respectively, and
    a single alignment plate including upper and lower mating surfaces configured to fit between the first and second chamber walls and to connect a bottom of the first chamber wall to a top of the second chamber wall via the upper and lower mating surfaces, respectively.

16. A method of fabricating a vacuum chamber, comprising:
    forming a chamber wall as a first tube;
    forming a second chamber wall as a second tube;
    forming a chamber top as a first plate;
    forming a chamber bottom as a second plate;
    sealing the chamber bottom to the second tube and sealing the chamber top to the first tube, and
    sealing the first tube to the second tube via a single alignment plate using fasteners extending from the chamber top to the chamber bottom.

17. The method as claimed in claim 16, wherein the step of forming the chamber wall comprises forming one of the chamber walls as a round tube.

18. The method as claimed in claim 16, wherein the step of forming one of the chamber walls comprises forming one of the chamber walls as an aluminum tube.

19. The method as claimed in claim 16, wherein the step of forming one of the chamber walls comprises forming one of the chamber walls as a rolled forging.

20. The method as claimed in claim 16, further comprising placing an O-ring between one of the chamber walls and at least one of the chamber bottom and the chamber top.

21. A vacuum processing system comprising:
top and bottom plates;
a first chamber wall;
a second chamber wall; and
means for connecting the bottom plate to the first chamber wall, the first chamber wall to the second chamber wall, and the second chamber wall to the top plate as a stack.

\* \* \* \* \*